United States Patent
Shin et al.

(10) Patent No.: US 11,036,597 B2
(45) Date of Patent: Jun. 15, 2021

(54) SEMICONDUCTOR MEMORY SYSTEM AND METHOD OF REPAIRING THE SEMICONDUCTOR MEMORY SYSTEM

(71) Applicant: SK hynix Inc., Icheon-si (KR)

(72) Inventors: Wongyu Shin, Icheon-si (KR); Jung Hyun Kwon, Seoul (KR); Seunggyu Jeong, Icheon-si (KR); Do Sun Hong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 195 days.

(21) Appl. No.: 16/212,302

(22) Filed: Dec. 6, 2018

(65) Prior Publication Data
US 2019/0303253 A1    Oct. 3, 2019

(30) Foreign Application Priority Data
Apr. 3, 2018  (KR) .......................... 10-2018-0038902

(51) Int. Cl.
*G06F 11/00* (2006.01)
*G06F 11/20* (2006.01)
*G06F 11/10* (2006.01)
*G11C 29/52* (2006.01)

(52) U.S. Cl.
CPC ...... *G06F 11/2007* (2013.01); *G06F 11/1068* (2013.01); *G06F 11/2094* (2013.01); *G11C 29/52* (2013.01); *G06F 2201/805* (2013.01)

(58) Field of Classification Search
CPC ....... G06F 11/08–1072; G06F 11/1666; G06F 11/2002; G06F 11/2007; G06F 11/2094
See application file for complete search history.

(56) References Cited

U.S. PATENT DOCUMENTS

| | | | | |
|---|---|---|---|---|
| 6,009,025 | A * | 12/1999 | Jacobson | G11C 29/88 365/200 |
| 2013/0326293 | A1* | 12/2013 | Muralimanohar | G06F 11/27 714/718 |
| 2017/0270017 | A1* | 9/2017 | Li | G06F 11/076 |
| 2019/0034270 | A1* | 1/2019 | Byun | G11C 29/52 |
| 2019/0042369 | A1* | 2/2019 | Deutsch | G06F 11/1068 |

FOREIGN PATENT DOCUMENTS

KR    1020120098327 A    9/2012

\* cited by examiner

*Primary Examiner* — Michael Maskulinski
(74) *Attorney, Agent, or Firm* — William Park & Associates Ltd.

(57) ABSTRACT

A semiconductor memory system includes a memory medium and a data input/output (I/O) pin repair control circuit. The memory medium includes a plurality of memory dies and a spare die. Each of the plurality of memory dies has a plurality of memory regions and a plurality of data I/O pins, and the spare die has a plurality of spare regions and a plurality of data I/O pins. The data I/O pin repair control circuit performs a repair process for replacing an abnormal data I/O pin among the plurality of data I/O pins included in any of the plurality of memory dies with a data I/O pin of the plurality of data I/O pins included in the spare die.

20 Claims, 9 Drawing Sheets

SEMICONDUCTOR MEMORY SYSTEM AND METHOD OF REPAIRING THE SEMICONDUCTOR MEMORY SYSTEM

CROSS-REFERENCE TO RELATED APPLICATIONS

The present application claims priority under 35 U.S.C. § 119(a) to Korean Application No. 10-2018-0038902, filed on Apr. 3, 2018, which is incorporated herein by references in its entirety.

BACKGROUND

1. Technical Field

Various embodiments of the present disclosure relate to a semiconductor memory system and, more particularly, to a semiconductor memory system and method of repairing the semiconductor memory system.

2. Related Art

Semiconductor memory devices employed in semiconductor memory systems for storing data may be typically categorized as either volatile semiconductor memory devices or nonvolatile semiconductor memory devices. The volatile semiconductor memory devices may store data by charging cell capacitors or discharging cell capacitors. The volatile semiconductor memory devices such as dynamic random access memory (DRAM) devices may retain their stored data when their power supplies are provided and may lose their stored data when their power supplies are interrupted. These volatile semiconductor memory devices may be mainly used as main memory devices of computer systems or the like. In contrast, the nonvolatile semiconductor memory devices may retain their stored data even when their power supplies are interrupted. The nonvolatile semiconductor memory devices may include flash memory devices, phase change random access memory (PCRAM) devices, etc., and may be mainly used as storage media for storing programs and data in computer systems, portable communication systems, or other application systems.

A semiconductor memory device may be packaged and used by a memory die or a memory chip. In some cases, a plurality of memory chips may be mounted and stacked on a substrate, like a printed circuit board (PCB), to provide a memory module. The memory module may further include a spare chip in addition to the plurality of memory chips. In the event of a memory chip failure, the memory chip and its functionality may be replaced by the spare chip.

SUMMARY

In accordance with the present teachings, a semiconductor memory system includes a memory medium and a data input/output (I/O) pin repair control circuit. The memory medium includes a plurality of memory dies and a spare die. Each of the plurality of memory dies has a plurality of memory regions and a plurality of data I/O pins, and the spare die has a plurality of spare regions and a plurality of data I/O pins. The data I/O pin repair control circuit performs a repair process for replacing an abnormal data I/O pin among the plurality of data I/O pins included in any of the plurality of memory dies with a data I/O pin of the plurality of data I/O pins included in the spare die.

Also in accordance with the present teachings, is a method of repairing a semiconductor memory system including a plurality of memory dies and a spare die, wherein each of the plurality of memory dies has a plurality of memory regions and a plurality of data input/output (I/O) pins, and wherein the spare die has a plurality of spare regions and a plurality of data I/O pins. The method includes performing a repair process for replacing an abnormal data I/O pin among the plurality of data I/O pins included in any of the plurality of memory dies with a data I/O pin of the plurality of data I/O pins included in the spare die.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

DETAILED DESCRIPTION

In the following description of embodiments, it will be understood that the terms "first" and "second" are intended to identify an element, but not used to define only the element itself or to mean a particular sequence. In addition, when an element is referred to as being located "on," "over," "above," "under," or "beneath" another element, it is intended to mean relative position relationship, but not used to impose the limitation that the two elements are in direct contact with one another. For example, there may be one or more intervening components present between the two elements. Accordingly, terms such as "on," "over," "above," "under," "beneath," "below" and the like are used herein for the purpose of describing particular embodiments only and are not intended to limit the scope of the present disclosure. Further, when an element is referred to as being "connected" or "coupled" to another element, the two elements may be electrically or mechanically connected or coupled together directly, or there may be one or more intervening components the two elements.

Various embodiments are directed to semiconductor memory systems supporting repair with a data input/output (I/O) terminal as a unit and methods of repairing the semiconductor memory systems.

In general, if one or more data I/O terminals of any one of a plurality of memory dies included in a memory medium malfunctions, a repair process may be performed to replace the memory die having the malfunctioning data I/O terminal with a spare die. After the repair process, if a command for selecting the memory die having the malfunctioning data I/O terminal occurs, the spare die may be selected by the command and data communication may be realized with the spare die instead of the memory die having the malfunctioning data I/O terminal. Each of the memory dies may have a plurality of data I/O terminals. Thus, even though one among the plurality of data I/O terminals of any one of the memory dies malfunctions, an entire portion of the spare die may be used to repair the memory die having only the single malfunctioning data I/O terminal. Accordingly, the present disclosure may provide semiconductor memory systems which are repairable in units of data I/O terminals such that two or more memory dies are repaired using only one spare die.

Figure 1:
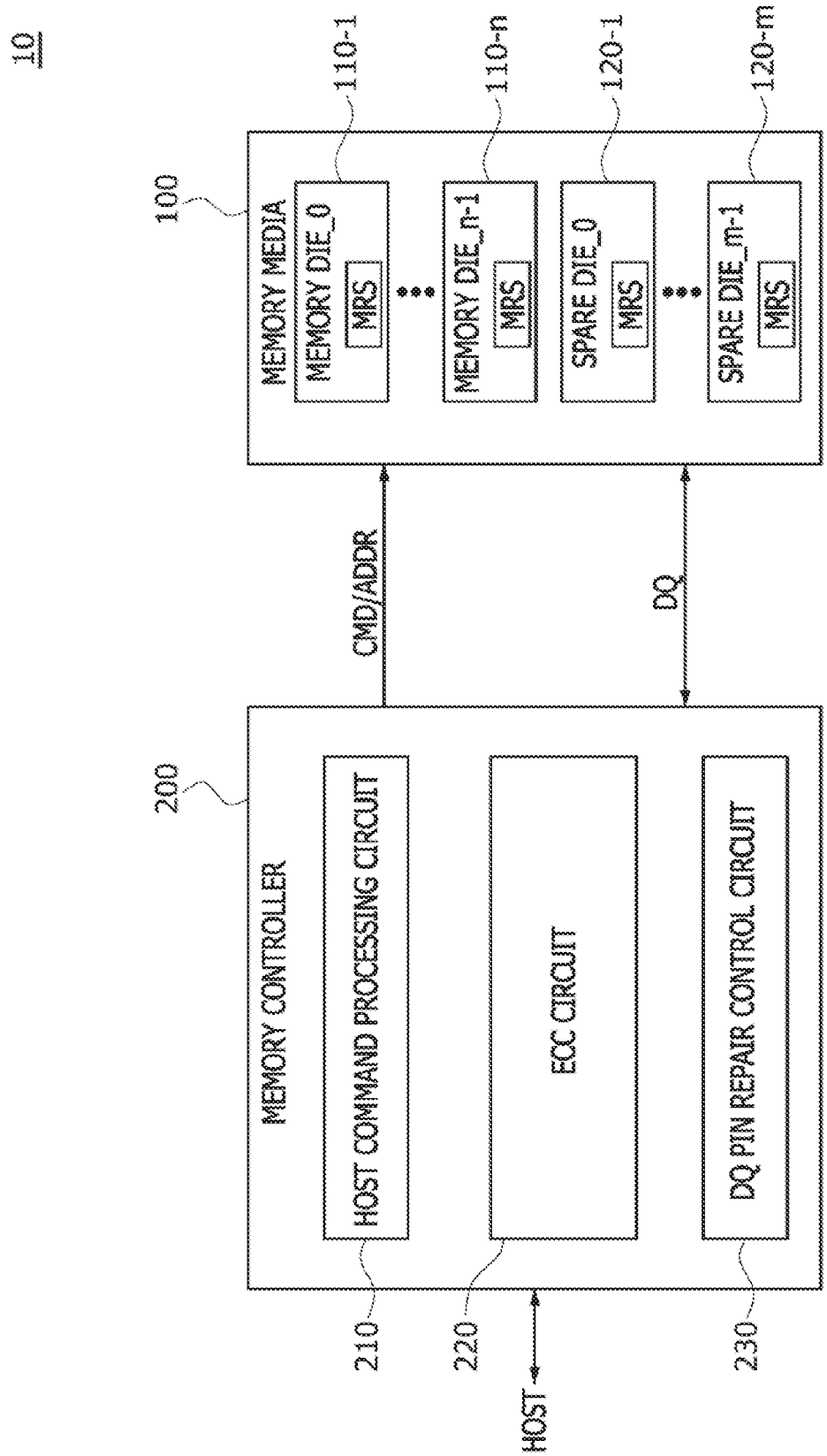
FIG. 1 shows a block diagram illustrating a semiconductor memory system, according an embodiment of the present disclosure.

FIG. 1 shows a block diagram illustrating a semiconductor memory system 10, according an embodiment of the present disclosure. Referring to FIG. 1, the semiconductor memory system 10 may be configured to include a memory medium 100 and a memory controller 200. In an embodiment, the memory medium 100 may have a configuration of a memory module. The memory medium 100 may include a plurality of memory dies (e.g., first to $n^{th}$ memory dies 110-1, ..., and 110-$n$) and a plurality of spare dies (e.g., first to $m^{th}$ spare dies 120-1, ..., and 120-$m$). In an embodiment, the first to $n^{th}$ memory dies 110-1, ..., and 110-$n$ and the first to $m^{th}$ spare dies 120-1, ..., and 120-$m$ may be realized using volatile semiconductor memory devices, such as DRAM devices. In another embodiment, the first to $n^{th}$ memory dies 110-1, ..., and 110-$n$ and the first to $m^{th}$ spare dies 120-1, ..., and 120-$m$ may be realized using nonvolatile semiconductor memory devices, such as PCRAM devices. Each of the first to $n^{th}$ memory dies 110-1, ..., and 110-$n$ and the first to $m^{th}$ spare dies 120-1, ..., and 120-$m$ may include a mode register set (MRS). Although not shown in FIG. 1, each of the first to $n^{th}$ memory dies 110-1, ..., and 110-$n$ and the first to $m^{th}$ spare dies 120-1, ..., and 120-$m$ may have a plurality of data I/O terminals (also referred to as data I/O pins) for data transmission. The memory medium 100 may communicate with the memory controller 200 through a data I/O line DQ. That is, the memory medium 100 may receive data from the memory controller 200 through the data I/O line DQ and may output the data to the memory controller 200 through the data I/O line DQ. In addition, the memory medium 100 may also communicate with the memory controller 200 through a command/address line CMD/ADDR. That is, the memory medium 100 may receive a command and an address from the memory controller 200 through the command/address line CMD/ADDR.

The memory controller 200 may be configured to include a host command processing circuit 210, an error correction code (ECC) circuit 220, and a data I/O (DQ) pin repair control circuit 230. The host command processing circuit 210 may be configured to process a command and an address which are outputted by a host. In an embodiment, a command processed by the host command processing circuit 210 may include a read command or a write command for the memory medium 100. In an embodiment, if the read command and the address are transmitted from the host to the host command processing circuit 210, the host command processing circuit 210 may operate to transmit read data in the memory medium 100, which is designated by the address, to the ECC circuit 220. In an embodiment, if the write command and the address are transmitted from the host to the host command processing circuit 210 and write data is transmitted from the host to the ECC circuit 220, then the host command processing circuit 210 may operate to store ECC encoded write data, which is encoded by the ECC circuit 220, to a storage region designated by the address among a plurality of storage regions of the memory medium 100.

The ECC circuit 220 may include an ECC encoder and an ECC decoder. The ECC encoder may perform an ECC encoding operation of the write data transmitted from the host during a write operation for the memory medium 100. The ECC encoder may perform the ECC encoding operation of the write data to generate a codeword including the write data and parity data. Data stored in the memory medium 100 may have a codeword form. The ECC decoder may perform an ECC decoding operation of the read data transmitted from the memory medium 100 during a read operation for the memory medium 100. If the read data has an error, the error may be detected and corrected by the ECC decoding operation. The error correction of the read data may be achieved within the range of an error correction capability of the ECC circuit 220. The error correction capability of the ECC circuit 220 may be defined as the number of erroneous bits or erroneous symbols which are correctable using the ECC circuit 220. The ECC encoding operation and the ECC decoding operation may be performed in units of bits or symbols, according to an error correction algorithm employed in the ECC encoding operation and the ECC decoding operation.

The data I/O (DQ) pin repair control circuit 230 may monitor whether any of the first to $n^{th}$ memory dies 110-1, ..., and 110-$n$ has at least one abnormal data I/O pin that malfunctions. In order to monitor the function of the first to $n^{th}$ memory dies 110-1, ..., and 110-$n$, the data I/O (DQ) pin repair control circuit 230 may access information on erroneous data generated by the ECC circuit 220. Whether any of the first to $n^{th}$ memory dies 110-1, ..., and 110-$n$ has at least one abnormal data I/O pin that malfunctions may be discriminated by monitoring the frequency of errors of data transmitted through the data I/O pins. For example, if the error occurrence frequency for the data transmitted through a first data I/O pin of the first memory die 110-1, included in the memory medium 100, is greater than a predetermined reference value, then the data I/O (DQ) pin repair control circuit 230 may regard the first data I/O pin of the first memory die 110-1 as an abnormal data I/O pin that is malfunctioning. The predetermined reference value for discriminating whether the data I/O pins of the first to $n^{th}$ memory dies 110-1, ..., and 110-$n$ are functioning normally or not may be set in relation to the reliability or desired reliability of the semiconductor memory system 10. In an embodiment, the predetermined reference value may be set to have a low number in order to increase the reliability of the semiconductor memory system 10. However, if the predetermined reference value is too low, the number of times that the repair process is performed may increase to cause a degradation in function of the semiconductor memory system 10. Accordingly, the determination of the reference value may be made with consideration of the performance of the semiconductor memory system 10.

If a specific data I/O pin among the plurality of data I/O pins is determined as being functioning abnormally by the data I/O (DQ) pin repair control circuit 230, then the data I/O (DQ) pin repair control circuit 230 may perform a repair process in units of data I/O pins. While the repair process is being performed in units of data I/O pins, there may be a disruption in accessing the memory medium 100. Thus, a halt command for interrupting the operation of the host for accessing the semiconductor memory system may be transmitted to the host before the repair process is performed. For some embodiments, the repair process performed in units of data I/O pins by the data I/O (DQ) pin repair control circuit 230 is not executed by replacing an entire portion of a memory chip having the abnormal data I/O pin with a spare die but executed by replacing only the abnormal data I/O pin with any one of a plurality of data I/O pins of the spare die. The repair process performed in units of data I/O pins is described below.

Figure 2:
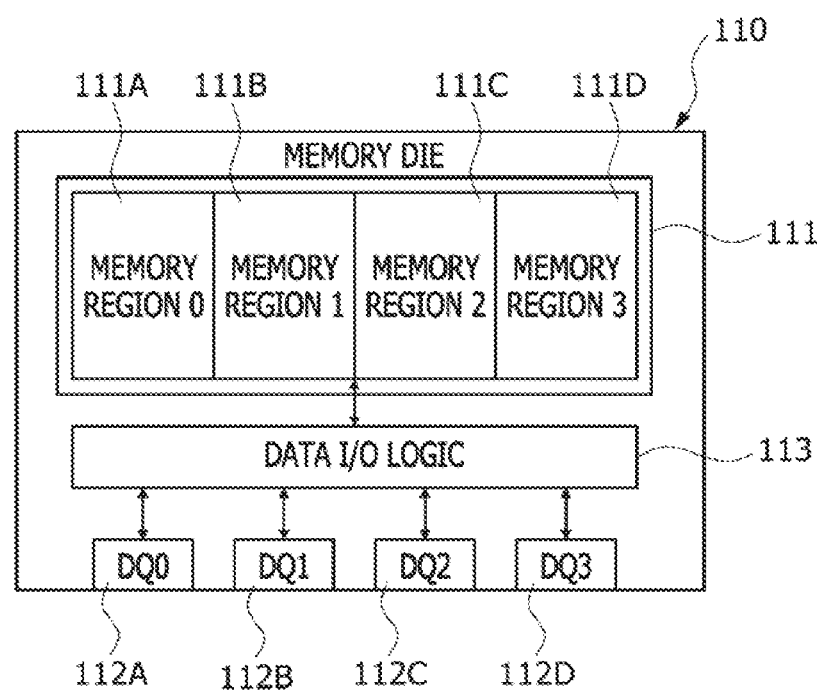
FIG. 2 shows a block diagram illustrating a configuration of a memory die included in a memory medium of the semiconductor memory system shown in FIG. 1.

FIG. 2 shows a block diagram illustrating a configuration of a memory die 110 corresponding to any one of the memory dies included in the memory medium 100 of the semiconductor memory system 10 shown in FIG. 1. That is, each of the first to $n^{th}$ memory dies 110-1, . . . , and 110-$n$ may have substantially the same configuration as the memory die 110 illustrated in FIG. 2. In FIG. 2, an MRS of the memory die 110 is omitted. Referring to FIG. 2, the memory die 110 may include a memory storage region 111 and a plurality of data I/O pins, for example, first to fourth data I/O pins DQ0, DQ1, DQ2 and DQ3 (also, denoted by '112A,' '112B,' '112C,' and '112D'). The memory storage region 111 may be divided into a plurality of memory regions, for example, first to fourth memory regions 111A, 111B, 111C, and 111D. The memory die 110 may further include a data I/O logic circuit 113 functioning as an interface circuit between the memory regions 111A, 111B, 111C, and 111D and the data I/O pins 112A, 112B, 112C, and 112D. For an embodiment, the number of the memory regions 111A, 111B, 111C, and 111D may be equal to the number of the data I/O pins 112A, 112B, 112C, and 112D.

In the present embodiment, the first to fourth memory regions 111A, 111B, 111C, and 111D may be distinguished from each other according to the first to fourth data I/O pins 112A, 112B, 112C, and 112D that execute data communication with the first to fourth memory regions 111A, 111B, 111C, and 111D. In an embodiment, the first memory region 111A may be defined as the region that receives or outputs data through the first data I/O pin 112A. The second memory region 111B may be defined as a region that receives or outputs data through the second data I/O pin 112B. The third memory region 111C may be defined as a region that receives or outputs data through the third data I/O pin 112C, and the fourth memory region 111D may be defined as a region that receives or outputs data through the fourth data I/O pin 112D.

Figure 3:
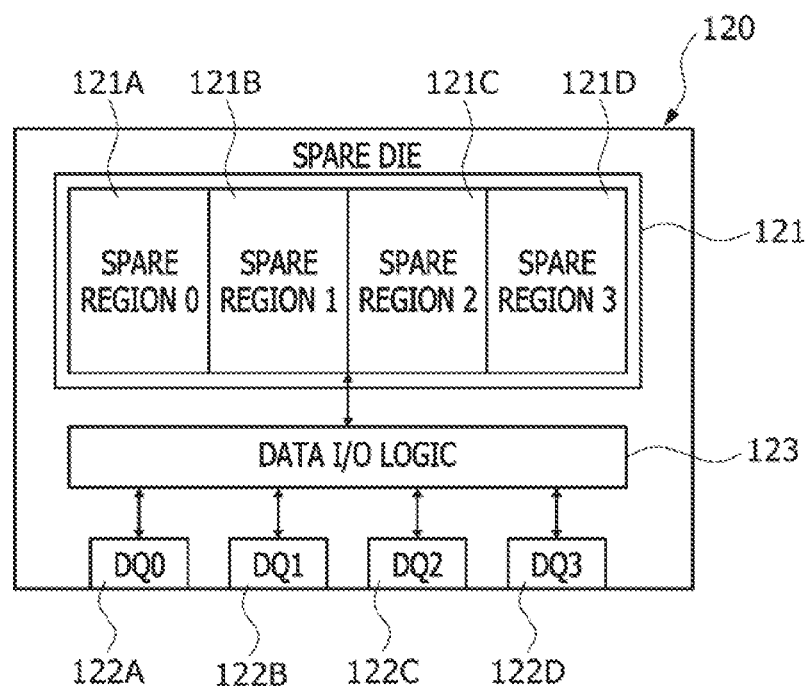
FIG. 3 shows is a block diagram illustrating a configuration of a spare die included in the memory medium of the semiconductor memory system shown in FIG. 1.

FIG. 3 shows a block diagram illustrating a configuration of a spare die 120 corresponding to any one of the spare dies included in the memory medium 100 of the semiconductor memory system 10 shown in FIG. 1. That is, each of the first to $m^{th}$ spare dies 120-1, . . . , and 120-$m$ may have substantially the same configuration as the spare die 120 illustrated in FIG. 3. In FIG. 3, an MRS of the memory die 120 is omitted. Referring to FIG. 3, the spare die 120 may include a spare storage region 121 and a plurality of data I/O pins, for example, first to fourth data I/O pins DQ0, DQ1, DQ2, and DQ3 (also, denoted by '122A,' '122B,' '122C,' and '122D'). The spare storage region 121 may be realized to have substantially the same configuration as the memory storage region 111 of the memory die 110 illustrated in FIG. 2. The spare storage region 121 may be divided into a plurality of spare regions, for example, first to fourth spare regions 121A, 121B, 121C, and 121D. The spare die 120 may further include a data I/O logic circuit 123 functioning as an interface circuit between the spare regions 121A, 121B, 121C, and 121D and the data I/O pins 122A, 122B, 122C, and 122D. The number of spare regions 121A, 121B, 121C, and 121D may be equal to the number of the data I/O pins 122A, 122B, 122C, and 122D, for an embodiment.

In the present embodiment, the first to fourth spare regions 121A, 121B, 121C, and 121D may be distinguished from each other according to the first to fourth data I/O pins 122A, 122B, 122C, and 122D that execute data communication with the first to fourth memory regions 121A, 121B, 121C, and 121D. In an embodiment, the first spare region 121A may be defined as a region that receives or outputs data through the first data I/O pin 122A. The second memory region 121B may be defined as a region that receives or outputs data through the second data I/O pin 122B. The third memory region 121C may be defined as a region that receives or outputs data through the third data I/O pin 122C, and the fourth memory region 121D may be defined as a region that receives or outputs data through the fourth data I/O pin 122D. The first spare region 121A, the second spare region 121B, the third spare region 121C, and the fourth spare region 121D of the spare die 120 may be designed to have substantially the same configuration as the first memory region 111A, the second memory region 111B, the third memory region 111C, and the fourth memory region 111D, respectively, of the memory die 110.

Figure 4:
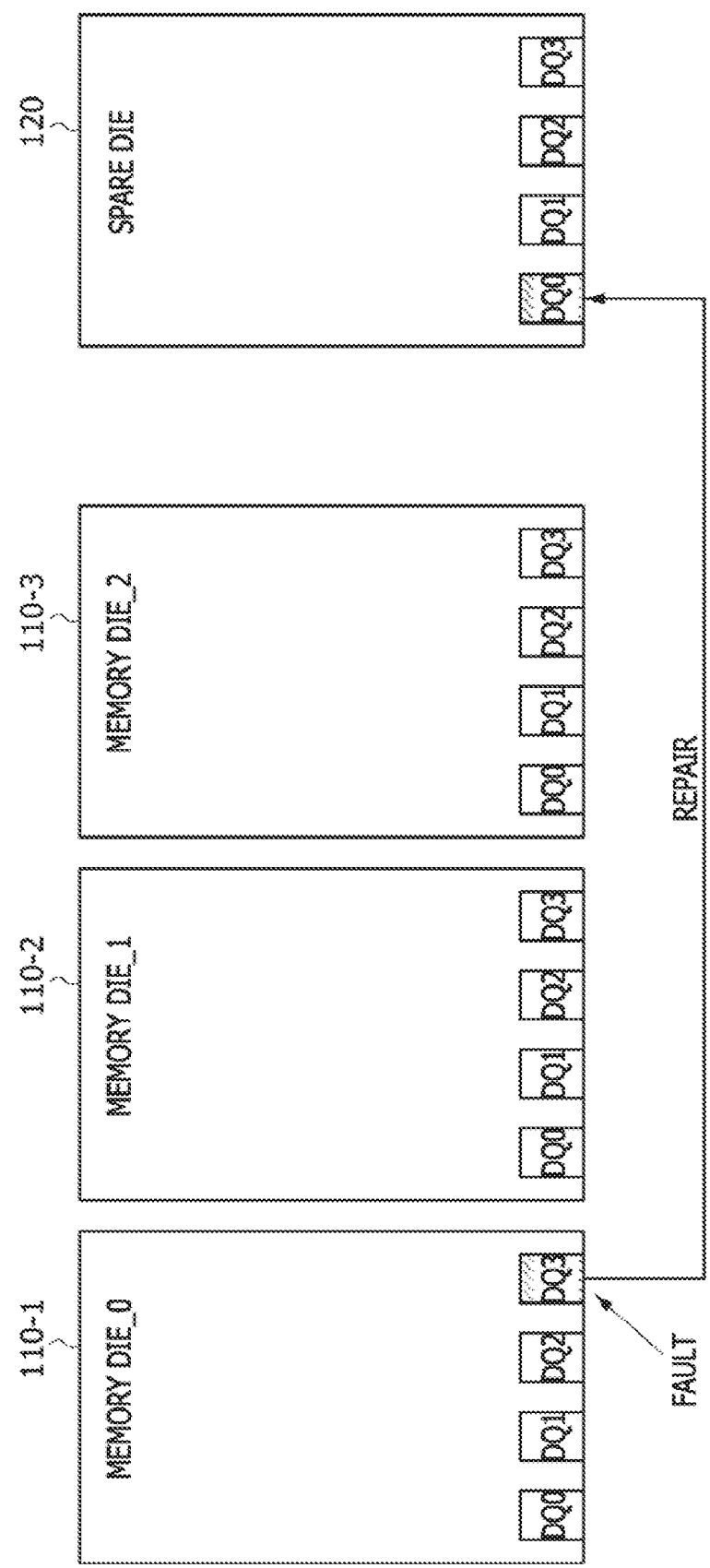
FIGS. 4 and 5 show schematic views illustrating a method of repairing a semiconductor memory system, according an embodiment of the present disclosure.
Figure 5:
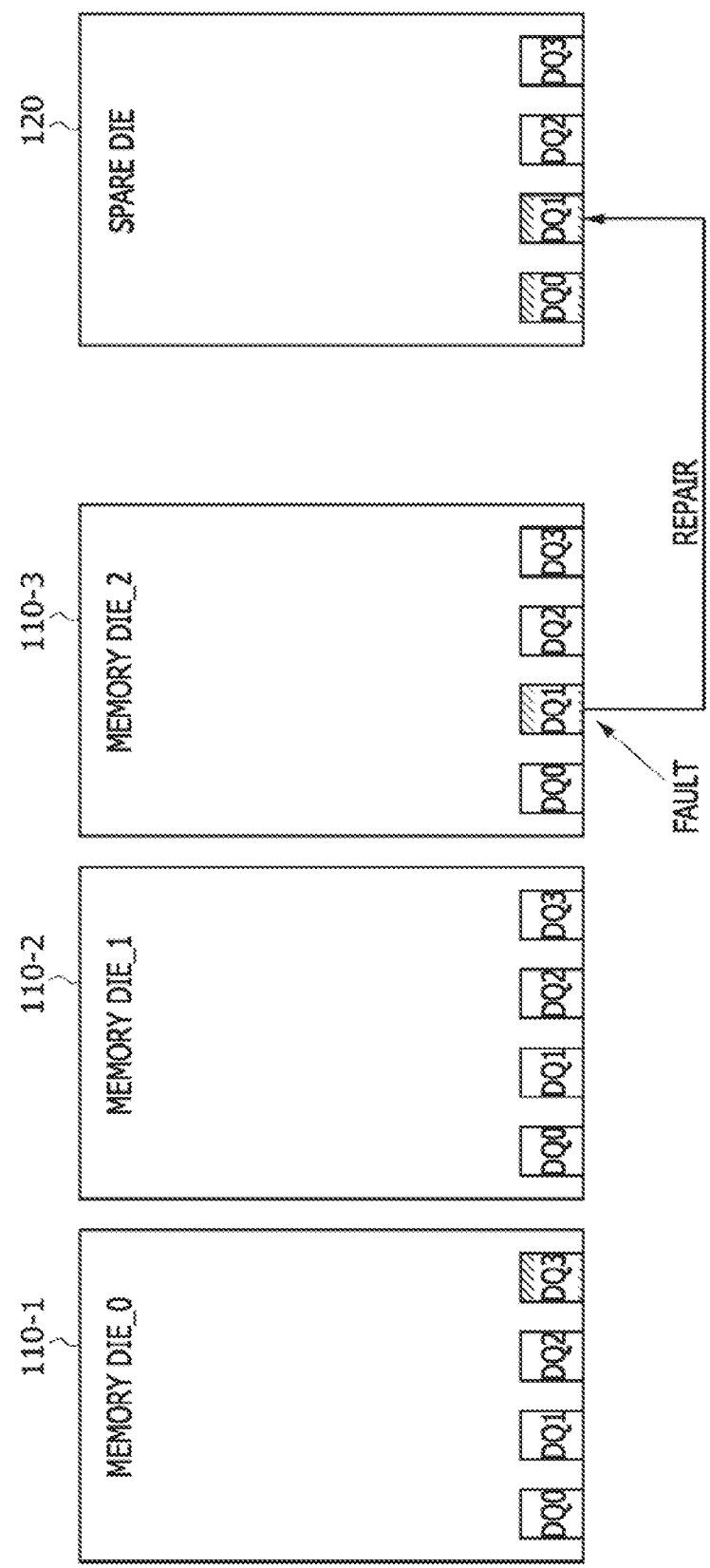

FIGS. 4 and 5 show schematic views illustrating a method of repairing the semiconductor memory system 10 shown in FIG. 1 in units of data I/O pins. The present embodiment is described as having three memory dies (i.e., the first to third memory dies 110-1, 110-2, and 110-3) and one spare die (i.e., the spare die 120 shown in FIG. 3). For other embodiments, semiconductor memory system different number of memory dies and spare dies. In the present embodiment, each of the first to third memory dies 110-1, 110-2, and 110-3 may have four data I/O pins DQ0, DQ1, DQ2, and DQ3. Each of the first to third memory dies 110-1, 110-2, and 110-3, for example, may have substantially the same configuration as the memory die 110 described with reference to FIG. 2. In addition, the spare die 120 may have substantially the same configuration as the spare die 120 described with reference to FIG. 3.

Referring to FIG. 4, if the fourth data I/O pin DQ3 among the data I/O pins DQ0, DQ1, DQ2, and DQ3 of the first memory die 110-1 is discriminated as an abnormal data I/O pin (denoted by the word 'FAULT') by the data I/O (DQ) pin repair control circuit 230 while the data stored in each of the first to third memory dies 110-1, 110-2, and 110-3 are read out, then a repair process may be performed to replace the fourth data I/O pin DQ3 of the first memory die 110-1 with a first data I/O pin DQ0 of the spare die 120 in units of data I/O pins. That is, the first to third data I/O pins DQ0, DQ1, and DQ2 of the first memory die 110-1 having the fourth data I/O pin DQ3 malfunctioning is not affected by the repair process. If the repair process for the fourth data I/O pin DQ3 of the first memory die 110-1 is performed, then data is transmitted through the first data I/O pin DQ0 of the spare die 120 instead of through the fourth data I/O pin DQ3 of the first memory die 110-1.

Referring to FIG. 5, it is assumed that the second data I/O pin DQ1 among the data I/O pins DQ0, DQ1, DQ2, and DQ3 of the third memory die 110-3 is discriminated as an abnormal data I/O pin (denoted by the word 'FAULT') by the data I/O (DQ) pin repair control circuit 230 after the repair process is performed to replace the fourth data I/O pin DQ3 of the first memory die 110-1 with the first data I/O pin DQ0 of the spare die 120 in units of data I/o pins. In such a case, another repair process may be performed to replace the second data I/O pin DQ1 (corresponding to an abnormal data I/O pin) of the third memory die 110-3 with any one of the remaining data I/O pins of the spare die 120, for example, with a second data I/O pin DQ1 of the spare die 120 in units of data I/O pins. That is, the data I/O pins DQ0, DQ2, and DQ3 of the third memory die 110-3 is not affected by the repair process for the second data I/O pin DQ1 of the third memory die 110-3. If the repair process for the second data I/O pin DQ1 of the third memory die 110-3 is performed, then data may be transmitted through the second data I/O pin DQ1 of the spare die 120 instead of through the second data I/O pin DQ1 of the third memory die 110-3.

Considering FIGS. 4 and 5 together, the first data I/O pin DQ0 of the spare die 120 replaces the abnormal data I/O pin DQ3 of the first memory die 110-1 in a first repair process (see FIG. 4). During a later-performed second repair process, the second data I/O pin DQ1 of the spare die 120 replaces the abnormal data I/O pin DQ1 of the third memory die 110-3 (see FIG. 5). As shown, the same spare die 120 is used on a pin-by-pin basis to repair two different memory dies, namely, the first die 110-1 and the third die 110-3. In another embodiment, two different pins on the spare die 120 are used to repair two different abnormal data I/O pins one the same memory die at different times.

After the repair process is performed in units of data I/O pins, data transmission through the abnormal data I/O pins of the memory dies is no longer executed. Instead, data transmission through the replaced data I/O pins of the spare die 120 is executed. For the successful execution of the repair process, data migration may be achieved such that data inputted to the abnormal data I/O pins of the memory dies are transmitted through the replaced data I/O pins of the spare die 120. Since the data stored in the memory dies have a form of a codeword generated by the ECC encoding operation, it may be necessary to perform the ECC decoding operation and the ECC encoding operation again using the ECC circuit 220 for the data migration.

Figure 6:
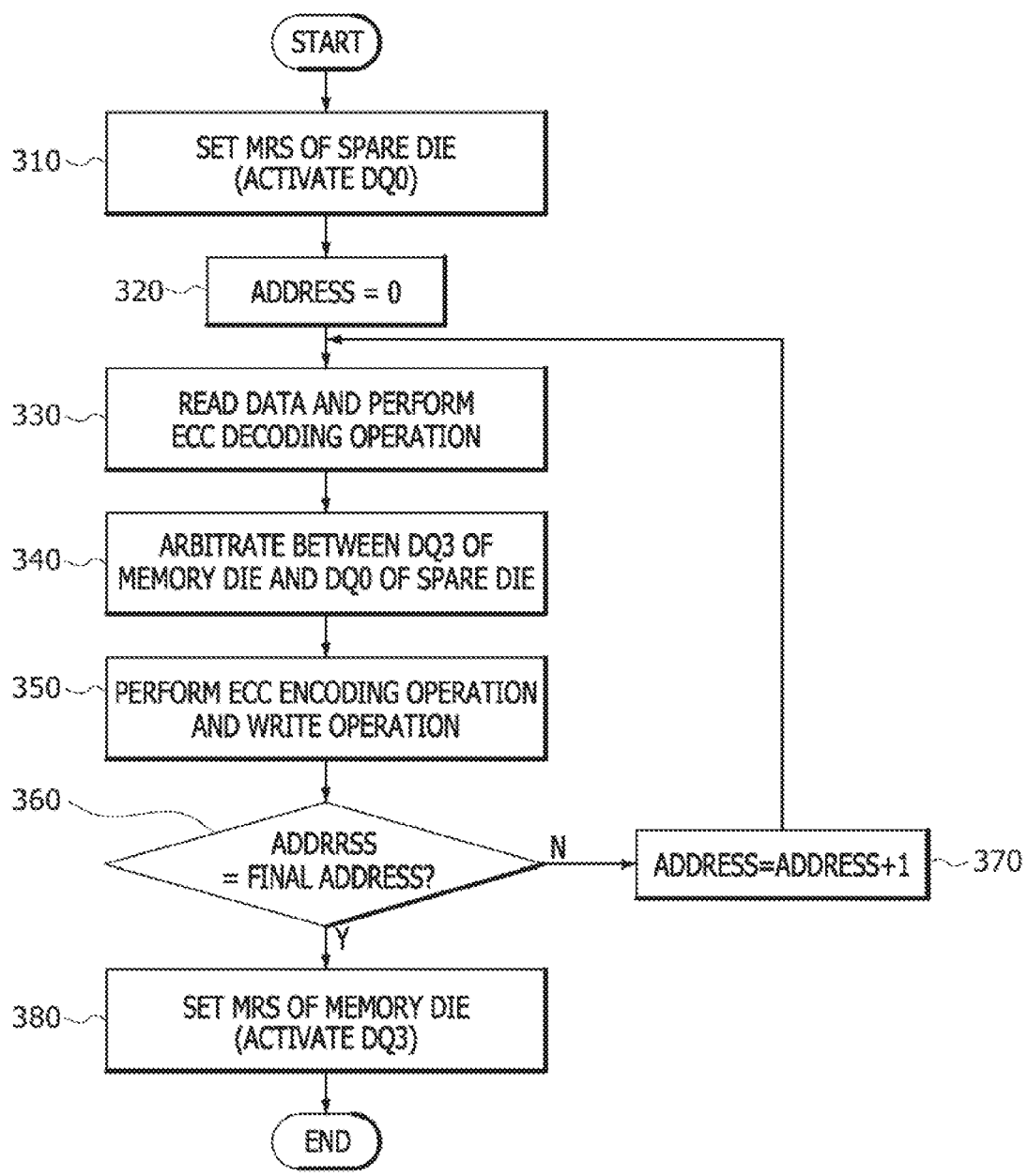
FIG. 6 shows a flowchart illustrating a method of repairing a semiconductor memory system, according an embodiment of the present disclosure.
Figure 7:
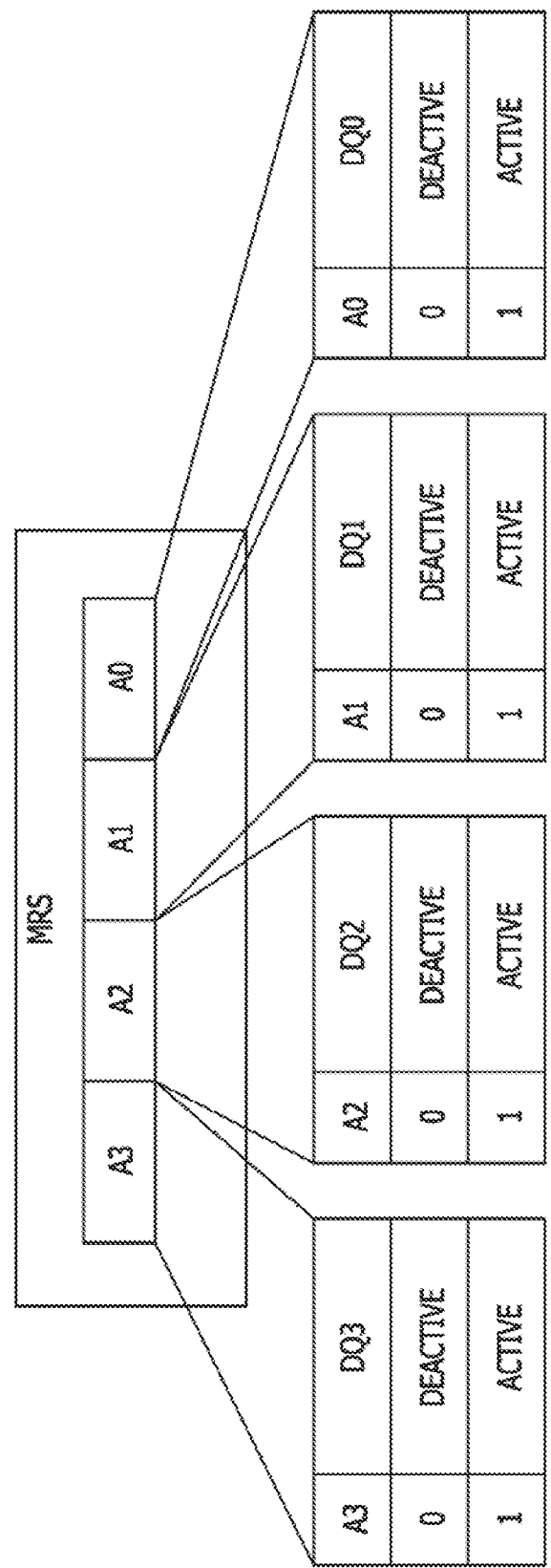
FIG. 7 shows a schematic view illustrating a process for changing data in a mode register set (MRS) during a repair process of a semiconductor memory system, according an embodiment of the present disclosure.
Figure 8:
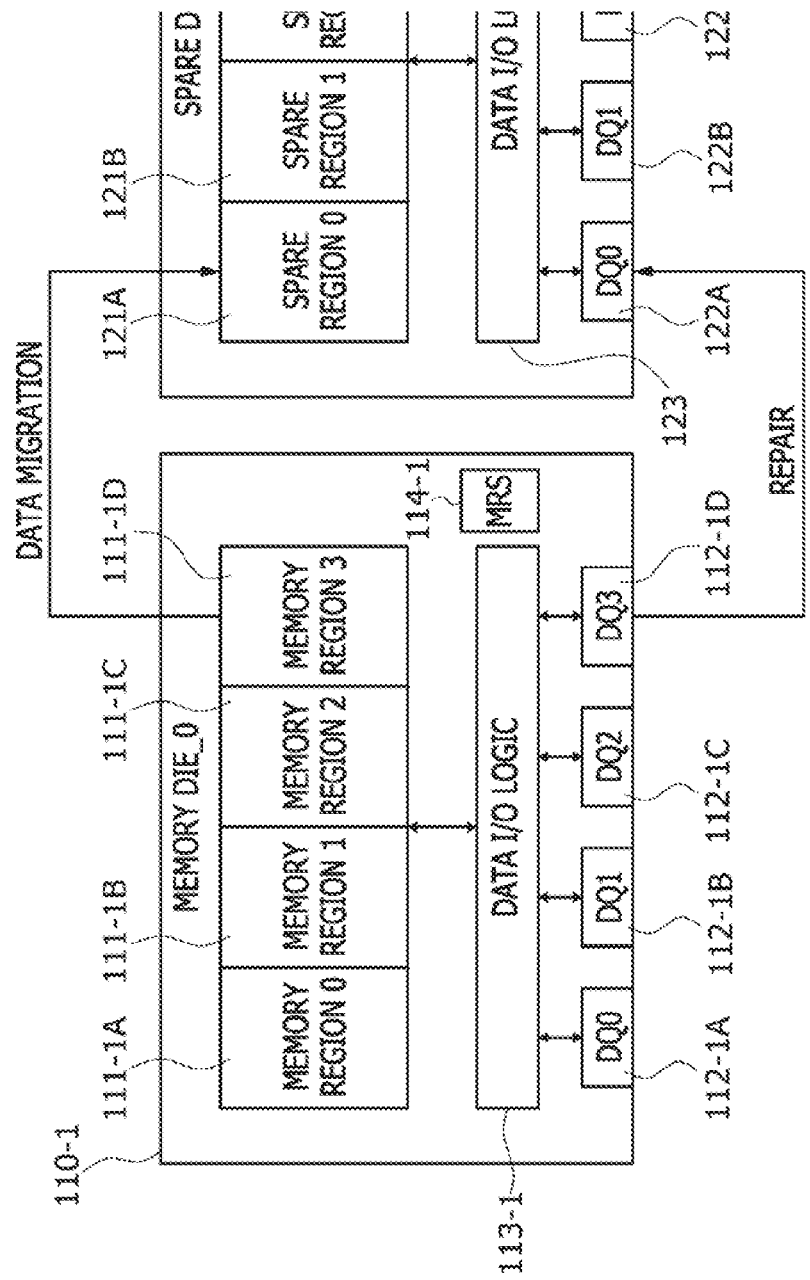
FIGS. 8 and 9 show block diagrams illustrating data migration during a repair process performed with data input/output (I/O) terminals as a unit in a semiconductor memory system, according an embodiment of the present disclosure.
Figure 9:
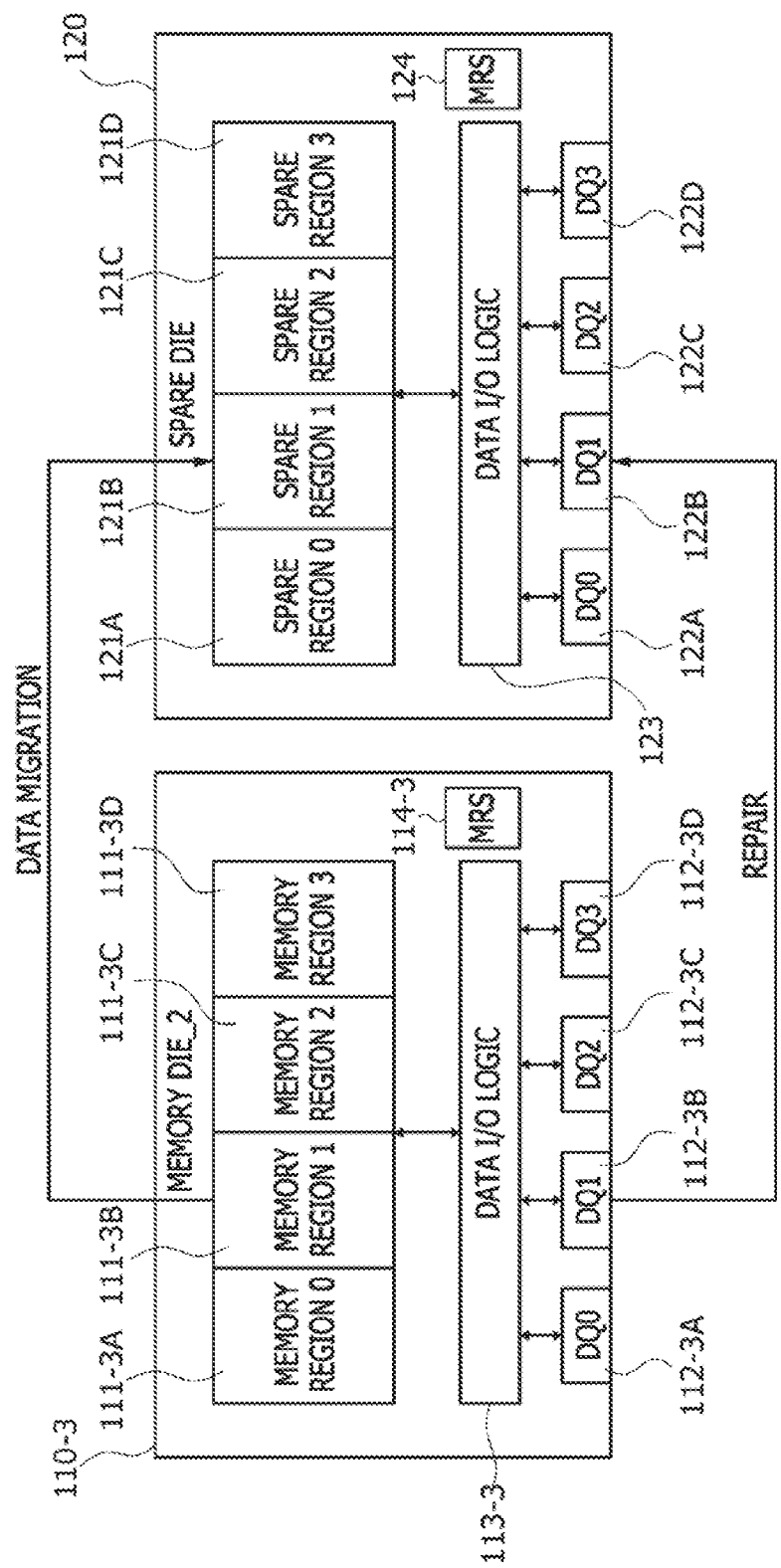

FIG. 6 shows a flowchart illustrating a method of repairing the semiconductor memory system 10 in units of data I/O pins, according to an embodiment of the present disclosure. FIG. 7 shows a schematic view illustrating a process for changing data in a mode register set (MRS) during a repair process of the semiconductor memory system 10, according an embodiment of the present disclosure. In addition, FIGS. 8 and 9 show block diagrams illustrating data migration during a repair process of the semiconductor memory system 10 performed in units of data I/O pins. Referring to FIG. 6, set values of the mode register set (MRS) of the spare die 120 may be changed to activate a first data I/O pin DQ0 of the spare die 120 (operation 310). As a result, data may be stored in a storage region of the spare die 120 through the first data I/O pin DQ0 of the spare die 120.

As illustrated in FIG. 7, the mode register set (MRS) may be configured to have a four-bit code which is capable of activating or deactivating the data I/O pins. Each of the MRSs included in the spare die 120 and the memory dies 110-1, 110-2, and 110-3 may be designed to have substantially the same configuration as the MRS illustrated in FIG. 7. A first bit A0 of the four-bit code may be used to activate or deactivate the first data I/O pin DQ0. For example, the first data I/O pin DQ0 may be deactivated if the first bit A0 has a logic level of "0", and the first data I/O pin DQ0 may be activated if the first bit A0 has a logic level of "1." A second bit A1 of the four-bit code may be used to activate or deactivate the second data I/O pin DQ1. For example, the second data I/O pin DQ1 may be deactivated if the second bit A1 has a logic level of "0," and the second data I/O pin DQ1 may be activated if the second bit A1 has a logic level of "1." A third bit A2 of the four-bit code may be used to activate or deactivate the third data I/O pin DQ2. For example, the third data I/O pin DQ2 may be deactivated if the third bit A2 has a logic level of "0," and the third data I/O pin DQ2 may be activated if the third bit A2 has a logic level of "1." A fourth bit A3 of the four-bit code may be used to activate or deactivate the fourth data I/O pin DQ3. For example, the fourth data I/O pin DQ3 may be deactivated if the fourth bit A3 has a logic level of "0," and the fourth data I/O pin DQ3 may be activated if the fourth bit A3 has a logic level of "1."

All of the data I/O pins DQ0 to DQ3 of the spare die 120 may be deactivated before a repair process is performed using the spare die 120. That is, all of the bits constituting the four-bit code of the MRS included in the spare die 120 may be set to have a logic level of "0" before a repair process is performed using the spare die 120. Thus, in order that the data migration for the repair process is achieved in units of data I/O pins, a logic level of the first bit A0 of the four-bit code of the MRS included in the spare die 120 may be firstly changed from "0" to "1" to activate the first data I/O pin DQ0. If data transmission through the first data I/O pin DQ0 of the spare die 120 is allowed by changing the set value of the MRS included in the spare die 120, the data migration from at least one of the memory dies 110-1, 110-2, and 110-3 to the spare die 120 may be executed.

As illustrated in FIG. 8, during the repair process performed in units of data I/O pins, the data migration may be achieved by moving data in a fourth memory region 111-1D transmitted through a fourth data I/O pin (DQ3) 112-1D (corresponding to an abnormal data I/O pin that malfunctions) of the first memory die 110-1 to the first spare region 121A of the spare die 120, controlled by the first data I/O pin (DQ0) 122A. The data stored in the fourth memory region 111-1D may be comprised of symbols corresponding to units of the ECC operation. In such a case, some of the symbols stored in the fourth memory region 111-1D may be encoded by an ECC encoding operation together with symbols stored in the other memory regions 111-1A, 111-1B and 111-1C included in the first memory die 110-1. Thus, before the data migration is executed, all of the data stored in all of the memory regions 111-1A, 111-1B, 111-1C, and 111-1D included in the first memory die 110-1 may be decoded by an ECC decoding operation and the ECC decoded data may be encoded by an ECC encoding operation. Before the ECC decoding operation and the ECC encoding operation for all of the data in the first memory die 110-1 are performed, an address may be set to be '0' (operation 320 of FIG. 6). The address of '0' may denote a first address of a memory storage region in the first memory die 110-1 having the fourth data I/O pin 112-1D that malfunctions.

After reading the data having the address of '0' in the first memory die 110-1, an ECC decoding operation of the read data may be performed (operation 330 of FIG. 6). During the operation 330, a parity bit included in the data having the address of '0' and a codeword form may be removed to provide an original read data, and the data having the address of '0' may be corrected within the range of an error correction capability of the ECC circuit 220 if an erroneous bit in included in the data having the address of '0.' After the ECC decoding operation of the read data is performed, an arbitration process may be performed to assign the fourth data I/O pin (DQ3) 112-1D (corresponding to an abnormal data I/O pin) of the first memory die 110-1 to the first data I/O pin DQ0 (122A) (corresponding to an activated data I/O pin) of the spare die 120 (operation 340 of FIG. 6). Next, an ECC encoding operation may be performed to encode the ECC decoded data, and a write operation may be performed to store the ECC encoded data to the spare die 120 (operation 350 of FIG. 6). In such a case, the ECC encoding operation may be performed in units of data stored in the first to fourth memory regions 111-1A, 111-1B, 111-1C, and 111-1D of the first memory die 110-1. That is, the ECC encoding operation of the data stored in the first memory region 111-1A, the ECC encoding operation of the data stored in the second memory region 111-1B, the ECC encoding operation of the data stored in the third memory region 111-1C, and the ECC encoding operation of the data stored in the fourth memory region 111-1D may be separately performed by each respective memory region.

After the ECC encoding operations are performed, the ECC encoded data other than the data stored in the fourth memory region 111-1D may be written to the first memory region 111-1A, the second memory region 111-1B, and the third memory region 111-1C during the write operation. Accordingly, the data written to the first memory region 111-1A may be transmitted through the first data I/O pin (DQ0) 112-1A of the first memory die 110-1. The data written to the second memory region 111-1B may be transmitted through the second data I/O pin (DQ1) 112-1B of the first memory die 110-1. The data written to the third memory region 111-1C may be transmitted through the third data I/O pin (DQ2) 112-1C of the first memory die 110-1. The data stored in the fourth memory region 111-1D may be written to the first spare region 121A of the spare die 120 during the write operation. The data written to the first spare region 121A may be transmitted through the first data I/O pin (DQ0) 122A of the spare die 120.

After the ECC encoding operation and the write operation for the data having the address of '0' are performed as operation 350, whether a current address (i.e., the address of '0') is a final address may be discriminated (operation 360 of FIG. 6). If the current address is not a final address, then the address may increase by one (operation 370 of FIG. 6). In such a case, the operations 330 to 360 for the data having the increased address may be sequentially executed again. If the address is a final address, then the MRS of the first memory die 110-1 having the fourth data I/O pin 112-1D corresponding to an abnormal data I/O pin may be set to deactivate the fourth data I/O pin 112-1D (operation 380 of FIG. 6). Specifically, as described with reference to FIG. 7, the fourth data I/O pin 112-1D may be deactivated by changing a logic level of a fourth bit A3 of an MRS 114-1 included in the first memory die 110-1 from '0' to '1.' As such, data transmission through the fourth data I/O pin 112-1D may be interrupted by changing a set value of the MRS 114-1 included in the first memory die 110-1.

As described with reference to FIG. 5, if the second data I/O pin (DQ1) 112-3B among the data I/O pins 112-3A, 112-3B, 112-3C, and 112-3D of the third memory die 110-3 is discriminated as an abnormal data I/O pin (denoted by the word 'FAULT') by the data I/O (DQ) pin repair control circuit 230 after the first data I/O pin 122A of the spare die 120 is used in the previous repair process performed in units of data I/O pins, then an additional repair process for third memory die 110-3 may be performed in units of data I/O pins. In such a case, the second data pin (DQ1) 112-3B corresponding to an abnormal data I/O pin of the third memory die 110-3 may be replaced with any one (e.g., the second data I/O pin 122B) of the remaining data I/O pins of the spare die 120. Specifically, the second data I/O pin 122B of the spare die 120 may be activated by changing a set value of the MRS 124 of the spare die 120. That is, the second data I/O pin 122B of the spare die 120 may be activated by changing a logic level of the second bit A1 of a four-bit code of the MRS 124 included in the spare die 120 from '0' to '1.'

As illustrated in FIG. 9, during the repair process for the third memory die 110-3 performed in units of data I/O pins, the data migration may be achieved by moving data in the second memory region 111-3B transmitted through the second data I/O pin (DQ1) 112-3B (corresponding to an abnormal data I/O pin that malfunctions) of the third memory die 110-3 to the second spare region 121B controlled by the second data I/O pin (DQ1) 122B of the spare die 120. In such a case, the data migration may be achieved in substantially the same way as described with reference to FIG. 8. That is, before the data migration is executed, ECC decoding operations of all of the data stored in all of the memory regions 111-3A, 111-3B, 111-3C, and 111-3D included in the third memory die 110-3 may be performed by increasing the address of the data, and the ECC decoded data may be encoded by ECC encoding operations. The ECC encoding operations of the memory regions 111-3A, 111-3B, 111-3C, and 111-3D may be separately performed by each respective memory region.

After the ECC decoding operations are performed, an arbitration process may be performed to assign the second data I/O pin (DQ1) 112-3B (corresponding to an abnormal data I/O pin) of the third memory die 110-3 to the second data I/O pin DQ1 (122B) (corresponding to an activated data I/O pin) of the spare die 120 before the ECC encoding operations are performed. Next, the ECC encoding operation for the ECC decoded data may be performed, and the ECC encoded data may be written to the spare die 120 by a write operation. Accordingly, the data stored in the second memory region 111-3B of the third memory die 110-3 may be written to the second spare region 121B of the spare die 120. If the data migration for all addresses is finished, then the second data I/O pin (DQ1) 112-3B corresponding to an abnormal data I/O pin of the third memory die 110-3 may be deactivated by changing a logic level of the second bit A1 of the four-bit code of the MRS 114-3 included in the third memory die 110-3 from '1' to '0.'

Embodiments disclosed herein have been described for illustrative purposes. Those of ordinary skill in the art will appreciate that various modifications, additions, and substitutions are possible for presented embodiments without departing from the scope and spirit of the present disclosure as disclosed in the accompanying claims.

What is claimed is:

1. A semiconductor memory system comprising:
   a memory medium comprising a plurality of memory dies and a spare die, wherein each of the plurality of memory dies has a plurality of memory regions and a plurality of data input and output (I/O) pins, and wherein the spare die has a plurality of spare regions and a plurality of data I/O pins; and
   a data I/O pin repair control circuit configured to perform a first repair process of replacing a first abnormal data I/O pin among the plurality of data I/O pins included in any of the plurality of memory dies with a first data I/O pin among the plurality of data I/O pins included in the spare die, wherein each of the memory regions included in a memory die of the plurality of memory dies is configured to receive or output data through each corresponding one of the data I/O pins included in the memory die;

wherein each of the spare regions included in the spare dies is configured to receive or output data through each corresponding one of the data I/O pins included in the spare die; and wherein the data I/O pin repair control circuit is further configured to perform a second repair process of replacing a second abnormal data I/O pin among the pluralities of data I/O pins included in the plurality of memory dies with a second data I/O pin among the plurality of data I/O pins included in the spare die, wherein the first and second abnormal data I/O pins belong to the same memory die, and wherein the second repair process is performed after the first repair process.

2. The semiconductor memory system of claim 1, wherein the data I/O pin repair control circuit is further configured to perform a third repair process of replacing a third abnormal data I/O pin among the pluralities of data I/O pins included in the plurality of memory dies with a third data I/O pin among the plurality of data I/O pins included in the spare die, wherein the first and third abnormal data I/O pins belong to different memory dies.

3. The semiconductor memory system of claim 1, further comprising an error correction code (ECC) circuit configured to perform an ECC operation during a read operation or during a write operation for the plurality of memory dies.

4. The semiconductor memory system of claim 3, wherein the data I/O pin repair control circuit is configured to control a data migration process that moves data in a memory region connected to the first abnormal data I/O pin to a spare region included in the spare die.

5. The semiconductor memory system of claim 4,
wherein the data I/O pin repair control circuit performs an ECC decoding operation, to generate ECC decoded data, of all data stored in memory regions included in a memory die having the first abnormal data I/O pin by increasing an address of the data;
wherein the data I/O pin repair control circuit performs an ECC encoding operation, to generate ECC encoded data, of the ECC decoded data; and
wherein the data I/O pin repair control circuit controls the data migration process by writing at least some of the ECC encoded data to any spare region included in the spare die.

6. The semiconductor memory system of claim 5, wherein the data I/O pin repair control circuit controls the first repair process so that the ECC encoding operations of the memory regions included in the memory die having the first abnormal data I/O pin are separately performed by each respective memory region.

7. The semiconductor memory system of claim 6, wherein the data written to the spare region through the first data I/O pin used in the repair process performed by the data I/O pin repair control circuit is defined as ECC encoded data of data in a memory region connected to the first abnormal data I/O pin among the memory regions of the memory die having the first abnormal data I/O pin.

8. The semiconductor memory system of claim 5, wherein each of the plurality of memory dies and the spare die includes a mode register set (MRS) that controls activation or deactivation of each of the data I/O pins included in each of the plurality of memory dies and the spare die.

9. The semiconductor memory system of claim 8,
wherein the data I/O pin repair control circuit sets the MRS of the memory die having the first abnormal data I/O pin to deactivate the first abnormal data I/O pin; and
wherein the data I/O pin repair control circuit sets the MRS of the spare die to activate the first data I/O pin, which is used in the repair process, among the data I/O pins included in the spare die.

10. The semiconductor memory system of claim 9,
wherein the data I/O pin repair control circuit controls the first repair process so that the MRS of the memory die having the first abnormal data I/O pin is set after the data migration process is executed; and
wherein the data I/O pin repair control circuit controls the first repair process so that the MRS of the spare die is set to activate the first data I/O pin, which is used in the repair process, among the data I/O pins of the spare die before the data migration process is executed.

11. The semiconductor memory system of claim 1, wherein the data I/O pin repair control circuit applies a halt command to a host before the repair process is performed to interrupt the host accessing the semiconductor memory system.

12. A method of repairing a semiconductor memory system comprising a plurality of memory dies and a spare die, wherein each of the plurality of memory dies has a plurality of memory regions and a plurality of data input and output (I/O) pins, and wherein the spare die has a plurality of spare regions and a plurality of data I/O pins, the method comprising:
performing a first repair process by replacing a first abnormal data I/O pin among the plurality of data I/O pins included in any of the plurality of memory dies with a first data I/O pin among the plurality of data I/O pins included in the spare die; and
performing a second repair process by replacing a second abnormal data I/O pin among the pluralities of data I/O pins included in the plurality of memory dies with a second data I/O pin among the plurality of data I/O pins included in the spare die, wherein the first and second abnormal data I/O pins belong to the same memory die, and wherein the second repair process is performed after the first repair process,
wherein each of the memory regions included in a memory die of the plurality of memory dies is configured to receive or output data through each corresponding one of the data I/O pins included in the memory die; and
wherein each of the spare regions included in the spare die is configured to receive or output data through each corresponding one of the data I/O pins included in the spare die.

13. The method of claim 12 further comprising performing a third repair process by replacing a third abnormal data I/O pin among the pluralities of data I/O pins included in the plurality of memory dies with a third data I/O pin among the plurality of data I/O pins included in the spare die, wherein the first and third abnormal data I/O pins belong to different memory dies.

14. The method of claim 12, wherein performing the first repair process comprises:
performing an arbitration process for assigning the first abnormal data I/O pin to any of the data I/O pins that are unused, due to a previous repair process, among the data I/O pins of the spare die; and performing a data migration process for writing data in a memory region connected to the first abnormal data I/O pin to any of the spare regions included in the spare die.

15. The method of claim 14 further comprising activating the data I/O pin of the spare die to which the first abnormal data I/O pin is assigned.

16. The method of claim 15, wherein the activating of the data I/O pin of the spare die to which the first abnormal data I/O pin is assigned is performed before the data migration process is performed.

17. The method of claim 14, wherein performing the data migration process comprises:
reading data stored in memory regions included in the memory die having the first abnormal data I/O pin by increasing an address of the data and performing an ECC decoding operation of the read data;
separately performing ECC encoding operations of the ECC decoded data of the memory regions included in the memory die having the first abnormal data I/O pin by the memory region; and
writing the ECC encoded data of the memory region connected to the first abnormal data I/O pin to any of the spare regions included in the spare die.

18. The method of claim 14, wherein performing the first repair process further comprises deactivating the first abnormal data I/O pin.

19. The method of claim 18, wherein deactivating the first abnormal data I/O pin is performed after the data migration process is performed.

20. The method of claim 12, further comprising applying a halt command, for interrupting an operation of a host accessing the semiconductor memory system, to the host before the first repair process is performed.

* * * * *